United States Patent [19]

Lee et al.

[11] Patent Number: 5,379,187
[45] Date of Patent: Jan. 3, 1995

[54] DESIGN FOR ENCAPSULATION OF THERMALLY ENHANCED INTEGRATED CIRCUITS

[75] Inventors: Sang S. Lee, Sunnyvale; George Fujimoto, Santa Clara, both of Calif.

[73] Assignee: VLSI Technology, Inc., San Jose, Calif.

[21] Appl. No.: 37,059

[22] Filed: Mar. 25, 1993

[51] Int. Cl.⁶ .................................... H05K 7/20
[52] U.S. Cl. .................... 361/707; 174/52.2; 257/720; 257/787; 361/713; 361/813
[58] Field of Search .............. 165/80.3, 185; 174/52.2, 52.4; 257/705–707, 711, 713, 720, 725, 753, 787, 792, 796; 264/272.11; 361/761, 764, 774, 776, 792, 704, 707, 713, 723, 783, 790, 794, 795, 813, 749; 437/210, 211, 220

[56] References Cited

U.S. PATENT DOCUMENTS

| | | | |
|---|---|---|---|
| 4,707,724 | 11/1987 | Suzuki | 357/71 |
| 4,835,120 | 5/1989 | Mallik | 437/209 |
| 4,906,802 | 3/1990 | Castleman | 174/52.4 |
| 5,065,281 | 11/1991 | Hernandez | 361/388 |
| 5,083,189 | 1/1992 | Sawaya | 357/72 |
| 5,136,471 | 8/1992 | Inasaka | 361/794 |
| 5,157,588 | 10/1992 | Kim | 174/52.4 |
| 5,225,499 | 7/1993 | Kokaku et al. | 525/530 |
| 5,249,101 | 9/1993 | Frey | 174/52.2 |
| 5,252,783 | 10/1993 | Baird | 174/52.2 |

FOREIGN PATENT DOCUMENTS 0208640  9/1987  Japan ........................ 264/272.11

*Primary Examiner*—Gerald P. Tolin
*Attorney, Agent, or Firm*—John P. Wagner, Jr.; Patrick T. King

[57] ABSTRACT

An improved packaging technique for packaging a thermally-enhanced, molded-plastic quad flat package (TE-QFP). An integrated-circuit die is attached to a thermally conductive, electrically-insulated substrate having a stepped area formed into the outer margins thereof. A lead frame has inwardly-extending fingers, which are attached to the stepped areas in the outer margins of the thermally conductive, electrically-insulated substrate. The stepped area centers the thermally conductive, electrically-insulated substrate and attached integrated-circuit die within the mold cavity so that the flow of plastic material is balanced over the top and bottom of the substrate to provide a molded package body substantially free of voids.

8 Claims, 3 Drawing Sheets

DESIGN FOR ENCAPSULATION OF THERMALLY ENHANCED INTEGRATED CIRCUITS

BACKGROUND OF THE INVENTION

1. Field of the Invention

The present invention relates to integrated-circuit package designs and, more specifically, to improved molded-plastic package designs for thermally enhanced integrated circuits.

2. Prior Art

FIG. 1A shows a conventional quad flat package (QFP) assembly 10 for an integrated-circuit die 12. The integrated-circuit die 12 is attached to an upset, or offset, die-attach paddle portion 14, which is at the center region of a conventional lead frame 16. Various inwardly-extending leads terminate at their inner ends in bonding fingers (typically shown as 18 and 20). The bonding fingers 18 and 20 are connected to respective bonding pads on the integrated-circuit die 12 using respective bonding wires (typically shown as 22), as indicated in the Figure. The entire assembly described above is conventionally encapsulated in a molded plastic material, which forms a molded-plastic body 26 for the package assembly 10.

FIG. 1B shows a plan view of the lead frame 16 for the conventional quad flat package (QFP) assembly 10. Note that the ends of the bonding fingers do not extend all the way to the die-attach paddle and are not directly connected to the die-attach paddle 14. This provides substantial spaces 30, 32, 34, 36 between the inner ends of the bonding fingers 18 and 20 and the die-attach paddle 14 of FIG. 1A for the flow of molding compound during an encapsulation process. The assembled die 12 and lead frame 16 combination are encapsulated in molded plastic material by being placed in a cavity formed by the two halves of a mold and by having plastic material be injected into the top half of the mold at one corner of the lead frame. Air vents are provided in the mold at the other three corners of the package. Some of the paths for the plastic material to flow into the bottom half of the mold from the too half of the mold are provided by the spaces 30, 32, 34, which are provided between the inner ends of the bonding fingers and the die-attach paddle. Other paths are provided by the spaces between the leads of the lead frame. These flow paths permit the flow of the plastic molding material to be substantially balanced between the top half and the bottom half of the of the mold as the plastic material flows through the mold. As plastic material is conventionally injected into the mold, air is expelled out of the air vents at the three corners of the mold by the flowing plastic material so that no air remains trapped within the molded-plastic body. If air were to be trapped, it would cause voids, blow holes, or pin holes, in the molded plastic body 26 of FIG. 1A.

FIG. 2 shows a package mold 60 for molding a conventional thermally-enhanced, quad flat package (TE-QFP). The package mold 60 has a top mold-half 62 and a bottom mold-half 64. A thermally-enhanced, electrically-insulated substrate 66, which is formed of a material such as, for example, alumina nitride, has an integrated-circuit die 68 mounted thereto. The thermally conductive, electrically-insulated substrate 66 replaces a conventional die-attach paddle( such as the die-attach paddle 14 of FIGS. 1A and 1B) and improves the thermal performance of a molded-plastic package. Bonding fingers (typically shown as 69 and 70) at the inner ends of the leads of a lead frame 72 are attached to the outer margins of the thermally conductive, electrically-insulated substrate 66 with an adhesive film 73 formed of a polyimide material such as R-flex 1000. As in the case of a conventional quad flat package (QFP) assembly, the thermally conductive, electrically-insulated substrate 66 and its attached integrated-circuit die 68 are placed in the cavity formed between the two halves 62 and 64 of the mold 60. Plastic material is injected into the top half of the mold at the inlet gate 74. The plastic material enters the top half 62 of the mold and flows through the spaces between the bonding fingers of the lead frame into the bottom half of the mold. Vents 76 in the mold corners release trapped air.

The arrows shown in FIG. 2 indicate the flow of plastic molding material through the top half of the mold and through the bottom half of the mold. Note that the thermally conductive, electrically-insulated substrate 66 is much greater in thickness than the conventional die-attach paddle 14 shown in FIGS. 1A and 1B. The intrusion of the much thicker bulk of the thermally conductive, electrically-insulated substrate 66 disrupts and unbalances the flow of plastic material in the mold in several ways.

One way that flow is disrupted is that the open spaces between the ends of the bonding fingers and the edge of the integrated-circuit die are blocked by the substrate 66.

Another way that flow is disrupted is that the bulk of the substrate 66 intrudes into the lower half of the mold so that the cross-sectional area for flow of molding material in the lower space of the cavity is smaller and the flow resistance is greater for the lower space. This causes in the flow of the molding material in the upper half of the mold to be faster than the flow of molding material in the lower half of the mold. As a result of these differences in flow, the air at different places within the mold halves is expelled at different rates so that, for example, some air is trapped within the bottom part of the mold. The trapped air creates voids, also called blow holes or pinholes, in the body of the package. A typical void 80 is created on the side of the package which is opposite the inlet gate 74, as illustrated in FIG. 2.

Consequently, a need exists for a technique to prevent voids on the body of a thermally-enhanced molded plastic package.

SUMMARY OF THE INVENTION

The present invention provides a balanced flow of a molding compound around a thermally-enhanced, electrically-insulated substrate and an attached integrated-circuit die, to provide an encapsulation package free of voids.

A package for a thermally-enhanced, molded-plastic quad flat package (TE-QFP) is provided. An integrated-circuit die is attached to a thermally conductive, electrically-insulated substrate, which has a central region to which the integrated-circuit die is attached. A lead frame with inwardly extending bonding fingers is attached to the outer margins of the thermally conductive, electrically-insulated substrate. Bonding wires are connected between respective bonding pads formed on the integrated-circuit die and the inwardly extending bonding fingers of the lead frame. A molded package body is formed of a plastic material around the integrated-circuit die, the substrate and the bonding fingers.

The thermally conductive, electrically-insulated substrate has a recessed area formed into the outer margins of it, at the locations where the inwardly extending bonding fingers will be attached to the thermally conductive, electrically-insulated substrate. The recessed area formed into the thermally conductive, electrically-insulated substrate balances the flow of the plastic molding material over the top and bottom of the substrate, and provides a molded package body substantially free of voids.

The recessed portion in the outer margins of the thermally conductive, electrically-insulated substrate is formed to a depth such that when the inwardly-extending bonding fingers of the lead frames are attached to the lower edge of the recessed portion, the substrate and attached integrated-circuit die will be elevated within the mold cavity. By elevating the thermally conductive, electrically-insulated substrate and attached integrated-circuit die within the mold cavity, the How cross-sectional area in the lower space of the cavity is increased. The additional cross-sectional area allows the molding compound to flow under the thermally conductive, electrically-insulated substrate with less restriction and at a balanced rate with the flow of the plastic molding material over the top of the thermally conductive, electrically-insulated substrate.

In one embodiment of the invention, the recessed area formed into the outer margins of the thermally conductive, electrically-insulated substrate is formed as a step, with the ends of the inwardly-extending bonding fingers attached to the lower edge of the step.

In another embodiment of the invention, in which an exposed slug of Copper or other similar material is used as a thermally conductive, electrically-insulated substrate, pathways are produced into and through the bottom of the exposed slug. The plastic molding material is then able to flow through these pathways, allowing for a balanced flow of the plastic molding material through the top and bottom half of the mold cavity.

A method is provided for forming a molded plastic package for an integrated-circuit die. The method includes the steps of attaching the integrated-circuit die to a central region of a thermally conductive, electrically-insulated substrate; attaching the inwardly-extending bonding fingers of a lead frame to the outer margins of the thermally conductive, electrically-insulated substrate; and molding a molded package body by flowing a plastic material into a mold placed around the integrated-circuit die, the thermally conductive, electrically-insulated substrate, and the bonding fingers of the lead frame. The step of molding the molded package includes the step of forming a recessed area into the outer margins of the thermally conductive, electrically-insulated substrate, over and under the substrate, and to provide a molded package body substantially free of voids.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 3:
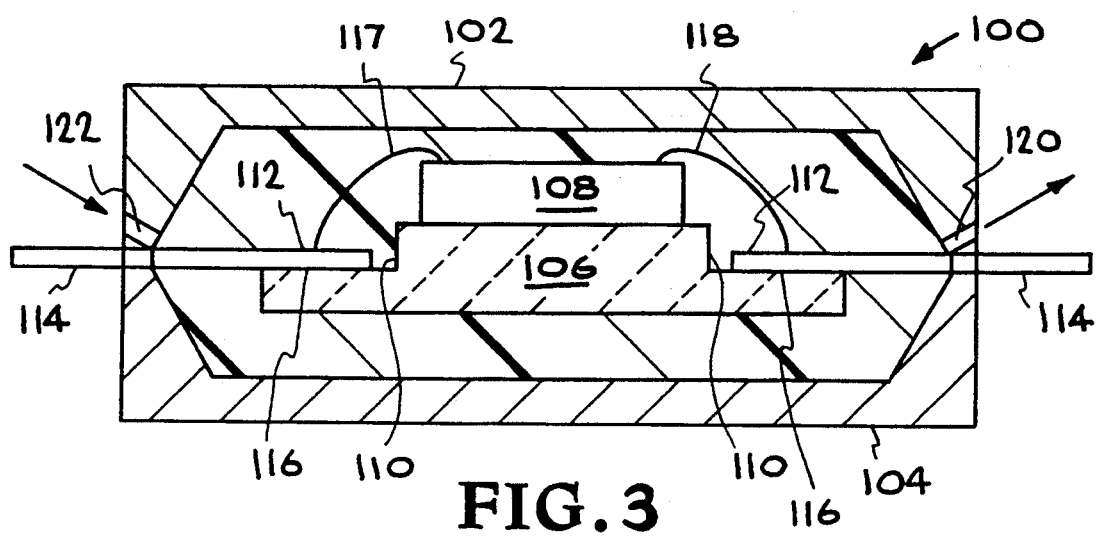
FIG. 3 is a sectional view of an upper mold half and a lower mold half containing a thermally conductive, electrically-insulated substrate having a recessed area formed in the margins therein for balancing the flow of plastic molding material.

FIG. 3 shows a package mold 100 for molding a modified thermally-enhanced, quad flat package (TE-QFP). The package mold 100 has a top mold-half 102 and a bottom mold-half 104.

A modified thermally-enhanced, electrically-insulated substrate 106 has an integrated-circuit die 108 mounted thereto. The substrate is formed of a material such as, for example, alumina nitride. The thermally conductive, electrically-insulated substrate improves the thermal performance of a molded-plastic package.

The modified thermally conductive, electrically-insulated substrate 106 has a stepped area 110 formed into the outer margins thereof, according to the invention. Bonding fingers at the inner ends of the leads 114 of a lead frame are attached to the stepped area 110 formed in the outer margins of the thermally conductive, electrically-insulated substrate 106 with an adhesive film 116 formed of a polyimide material such as R-flex 1000. The bonding fingers 112 are located in a central plane which extends along the horizontal axes of the package assembly.

The stepped area 110 allows the substrate 106 and the attached integrated-circuit die 108 to be centered within the mold cavity$_x$ on either side of the central plane in order to balance the flow of plastic molding material in the upper and lower halves of the mold during the package-molding process. This balanced flow substantially eliminates voids or, blowholes, in the molded body of the package.

Representative bonding wires 117, 118 are shown connected between respective bonding pads formed on the integrated-circuit die 108 and the inwardly-extending bonding fingers 112 of the lead frame.

The stepped area 110 permits the attached bonding fingers 112, which are located approximately along the centerline of the body of the package, to center the thermally conductive, electrically-insulated substrate 106 and attached integrated-circuit die 108 within the mold cavity. The arrows show the flow of the plastic molding material through the upper mold half 102 and the lower mold half 104. The molding material is, for example, a standard molding compound such as provided by the Sumitomo Company as 6300 HS or HG molding compound, or as 7320C low viscosity molding compound. The centering of the thermally conductive, electrically-insulated substrate 106 and attached integrated-circuit die 108 provide for a balanced flow of the plastic molding material in the upper half 102 of the mold cavity and the lower half 104 of the mold cavity. Since there is a balanced flow of plastic material in both halves, the top and bottom flows meet near the air vent 120 opposite the inlet 122 to eliminate voids caused by trapped air.

Figure 1A:
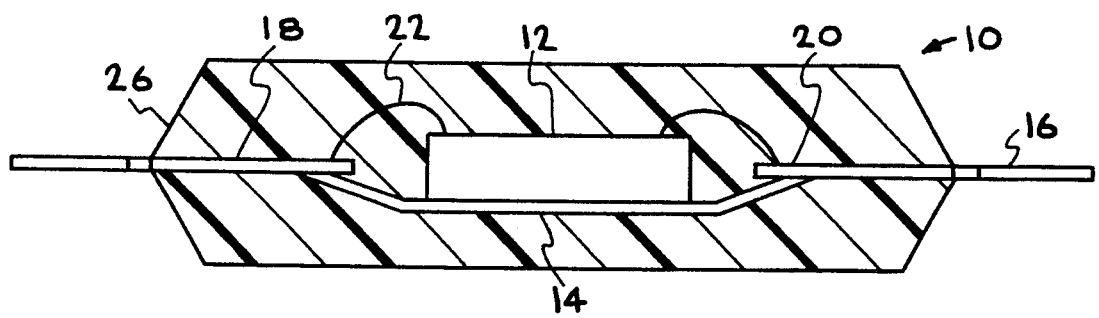
FIG. 1A is a sectional, elevation view of a conventional quad flat package (QFP) for an integrated circuit.
Figure 1B:
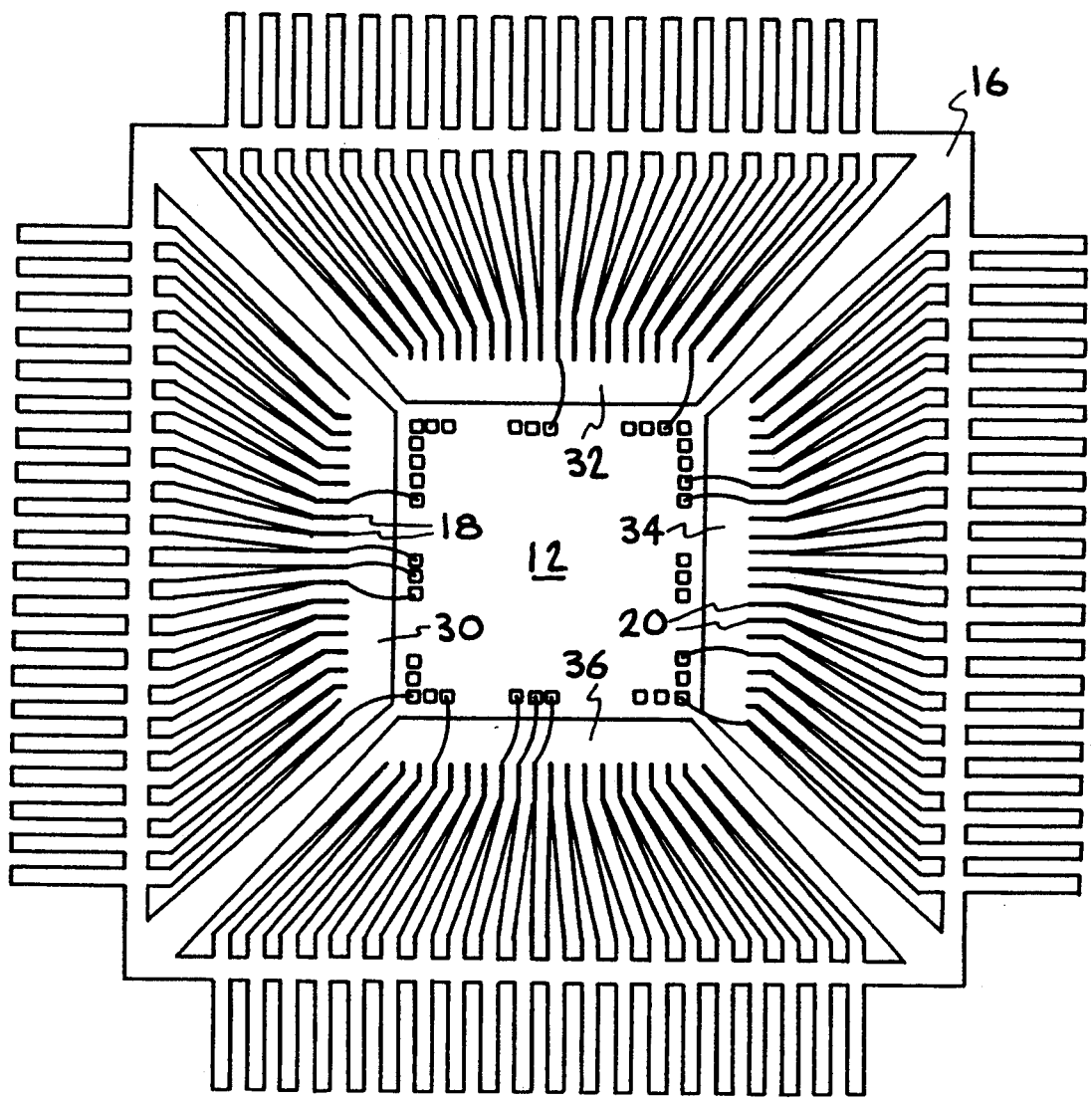
FIG. 1B is a plan view of a lead frame for a conventional quad flat package (QFP).
Figure 2:
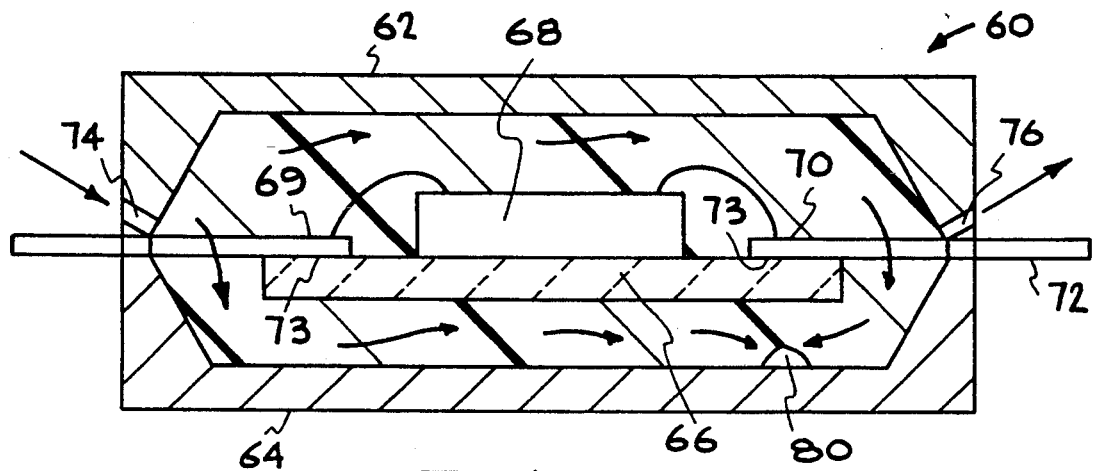
FIG. 2 is a sectional, elevation view of a thermally-enhanced, molded quad flat package (TE-QFP), which uses a thermally conductive, electrically-insulated substrate for mounting an integrated-circuit die.

Because the thermally conductive, electrically-insulated substrate 106 is much greater in thickness than the conventional die-attach paddle 14 shown in FIGS. 1A, the intrusion of the much thicker bulk of the thermally conductive, electrically-insulated substrate can disrupt and unbalances the flow of plastic material in the mold in several ways. Flow through the open spaces between the ends of the bonding fingers and the edges of the integrated-circuit die is blocked by the substrate 106. The technique of centering the substrate in the mold cavity prevent voids on the body of a thermally-enhanced molded plastic package.

Figure 4:
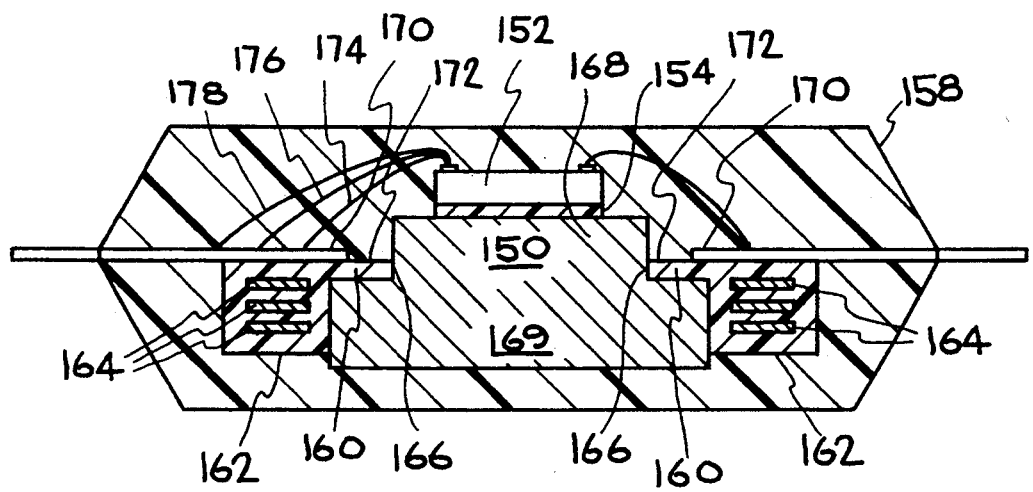
FIG. 4 is a sectional view of a package configuration using a printed-circuit board and a heat-conductive slug.

FIG. 4 illustrates an alternative embodiment of a package configuration. In this embodiment, a heat conductive copper or silicon carbide slug 150 provides thermal conduction for an integrated-circuit die 152. The integrated-circuit die 152 is fixed to the top surface of the slug 150 with a thin intermediate insulating layer 154, if required, therebetween. The slug 150 functions to conduct heat away from the integrated-circuit die 152. The slug 150 has a stepped area 60 formed into its sidewalls.

A multi-layer printed-circuit-board 162 is built up as a sandwich structure having a series of insulated layers alternating with various conductors 164 formed on the various surfaces of the layers within the board 162. These conductors are used to provide, for example, signal connections, VSS power connections, and VDD ground connections to the integrated-circuit die 152.

The multi-layer printed-circuit-board 162 includes an inwardly extending portion 166. As illustrated in the Figure, the bottom surface of the inwardly extending portion 166 of the board 162 is fixed to the surface of the stepped area 160 of the slug 150.

The multi-layer printed-circuit-board 162 includes a central opening through which an upper portion 168 of the slug extends, leaving a lower portion 169 of the slug below that opening, as illustrated in the Figure. Consequently some of the bulk of the slug 150 extends into the upper half of the body of the package and some of the bulk extends into the lower half of the body of the package.

A series of bonding fingers 170 at the inner ends of the leads of a leadframe are fixed to the top surface of the printed-circuit-board 162 by having the lower surfaces of the bonding fingers fixed to the top surface 172 of the board 162. The bonding fingers are located in a horizontally-extending, central plane defined by the of the lead frame. The central plane extends through the center of the package. Wire-bonded connections are made between various bonding pads on the surface of the integrated-circuit die 152 and respective bonding pads on the top surface of the printed-circuit-board 162. For example, a wire-bond wire 174 provides a connection to the die for VSS power; a wire-bond wire 176 provides a connection to the die for VDD ground; and a wire-bond wire 178 provides a connection to the die for signals.

The stepped area 160 formed in the slug 150 allows the upper portion 168 of the slug and the attached integrated-circuit die 152 to extend significantly above the central plane of the lead frame. When the molded-plastic body of a package 158 is being formed in a mold (such as the mold 100 disclosed in connection with FIG. 3 herein above), plastic molding material flows around the die 152 and the upper portion 168 of the slug. In the lower half of a die mold, that is, below the plane of the bonding fingers 170 of the leadframe, plastic molding material flows around the printed-circuit-board 162 and the lower portion 169 of the slug 150.

In order to balance the flow of plastic molding material in the upper and lower halves of the mold, the flows through these halves of the mold are balanced. The upper flow is modulated by the upper portion 168 of the slug 150 and the integrated-circuit die 152. The lower flow is modulated by the printed-circuit board 162 and lower portion 169 of the slug 150. These flows are balanced to substantially eliminate voids, or blowholes, in the molded body of the package caused by air trapped in the mold.

Figure 5:
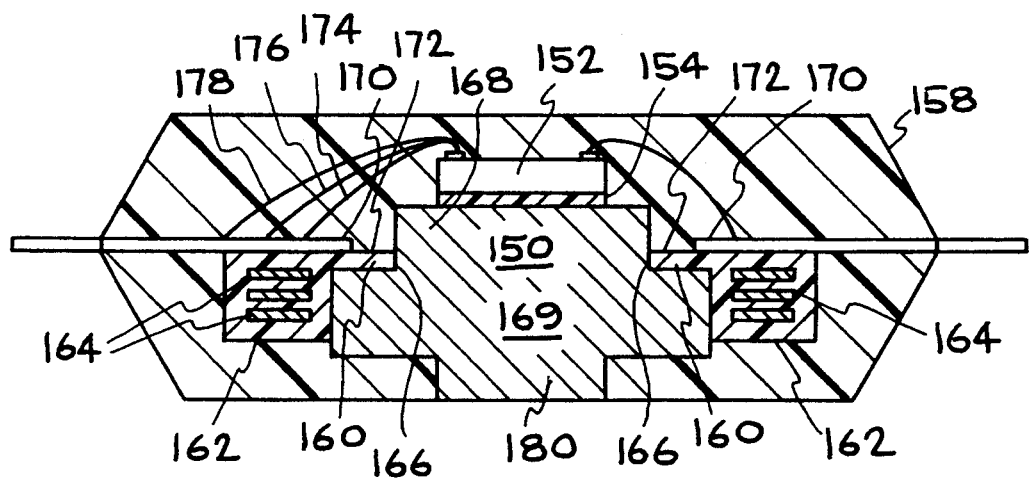
FIG. 5 is a sectional view similar to that of FIG. 4, with the heat-conductive slug extending to the surface of the body of the package.

FIG. 5 shows a package configuration similar to that of FIG. 4. The heat-conductive slug 150 includes an additional portion 180 which extends from the lower portion 169 of the slug to the surface of the body of the package 58. This provides a direct thermal connection at the surface of the package for direct exposure to ambient air or for connection to a heat sink or the like. In this configuration, flow through the lower half of a mold is somewhat restricted by the additional portion 180 of the slug 150 and corresponding adjustments in the balance of flows is provided to compensate.

The invention provides an improved method for forming a molded plastic package for an integrated-circuit die. The method includes attaching the integrated-circuit die to a central region of a thermally conductive, electrically-insulated substrate having a recessed area formed into the outer margins thereof. The inwardly-extending bonding fingers of the lead frame are attached to the lower portion of the recessed area carved into the outer margins of the thermally conductive, electrically-insulated substrate. A molded package body is formed by flowing a plastic material into a mold placed around the integrated-circuit die, the thermally conductive, electrically-insulated substrate, and the bonding fingers of the lead frame. Centering the thermally conductive, electrically-insulated substrate and attached integrated-circuit die within the mold cavity balances the flow of plastic material both over and under the thermally conductive, electrically-insulated substrate, and provides a molded package body substantially free of voids.

An improved method is also shown for forming a molded plastic package for an integrated-circuit die in which a slug of copper or similar material is used as a thermally conductive, electrically-insulated substrate. The method includes attaching an integrated-circuit die to a central region at one end of the slug. Inwardly-extending bonding fingers of a printed-circuit board are attached to a stepped portion of the slug. Bonding fingers of a lead frame are attached to the printed-circuit board. A molded package body is formed by flowing a plastic material into a mold placed around the integrated-circuit die, the circuit board, the slug, and the bonding fingers of the lead frame.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An improved package assembly for a thermally-enhanced, molded-plastic quad fiat package (TE-QFP), comprising:
   a thermally conductive, electrically-insulated substrate having a top surface with a central region to which an integrated-circuit die is attached
   a molded body of plastic material formed around said a thermally conductive, electrically-insulated substrate;
   means for centering the thermally conductive, electrically-insulated substrate in the package body about a central plane in which a lead frame lies, said centering means including a recessed surface formed in the sidewalls of said substrate, said recessed surface formed into the top surface of said thermally conductive, electrically-insulated substrate such that said peripherally surrounded by said recessed surface; and
   wherein the lead frame has bonding fingers located in a central plane of the package assembly and wherein the thermally conductive, electrically-insulated substrate includes a heat conductive slug having a recessed area formed around its outer margins and includes a multilayer printed circuit board having a central opening through which a portion of said heat conductive slug extends, a portion of the heat conductive slug extending above the central plane and the recessed area of the heat conductive slug extending below the central plane.

2. The package assembly of claim 1 wherein the thermally conductive, electrically-insulated substrate is formed of an alumina nitride material.

3. The package of claim 1 wherein the heat conductive slug is formed of a copper material.

4. The package of claim 1 wherein the heat conductive slug is formed of a silicon carbide material.

5. An improved package for a thermally-enhanced, molded-plastic quad fiat package (TE-QFP), comprising:
   an integrated-circuit die;
   a thermally conductive, electrically-insulated substrate having a top surface with a central region to which said integrated-circuit die is attached; said thermally conductive, electrically-insulated substrate having a recessed area formed at the outer margins thereof, said recessed area formed into the top surface of said thermally conductive: electrically-insulated substrate such that said integrated-circuit die is peripherally surrounded by said recessed area,
   a lead frame having inwardly-extending bonding fingers, which are attached to the outer margins of said thermally conductive, electrically-insulated substrate, wherein said inwardly extending bonding fingers are coupled to the recessed area of said substrate so that the thermally conductive, electrically-insulated substrate is centered within the molded package body;
   bonding wires connected between respective bonding pads formed on said integrated-circuit die and said inwardly extending bonding fingers of said lead frame;
   a molded package body formed of a plastic material, which is molded around said integrated-circuit die, said thermally conductive, electrically-insulated substrate, and said inwardly extending bonding fingers; and
   wherein the bonding fingers are located in a central plane of the package assembly and wherein the thermally conductive, electrically-insulated substrate includes a heat conductive slug having a recessed area formed around its outer margins and includes a multilayer printed circuit board having a central opening through which a portion of said heat conductive slug extends, a portion of the heat conductive slug extending above the central plane and said recessed area of the heat conductive slug extending below the central plane.

6. The package of claim 5 wherein said thermally conductive, electrically-insulated substrate is formed of alumina nitride material.

7. The package of claim 5 wherein the heat conductive slug is formed of a copper material.

8. The package of claim 5 wherein the heat conductive slug is formed of a silicon carbide material.

* * * * *